(12) United States Patent
Miyagawa et al.

(10) Patent No.: US 9,099,645 B2
(45) Date of Patent: Aug. 4, 2015

(54) RESISTANCE RANDOM ACCESS MEMORY DEVICE

(71) Applicant: Kabushiki Kaisha Toshiba, Minato-ku (JP)

(72) Inventors: Hidenori Miyagawa, Kanagawa-ken (JP); Shosuke Fujii, Kanagawa-ken (JP); Takayuki Ishikawa, Kanagawa-ken (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 40 days.

(21) Appl. No.: 14/022,798

(22) Filed: Sep. 10, 2013

(65) Prior Publication Data

US 2014/0284544 A1  Sep. 25, 2014

Related U.S. Application Data

(60) Provisional application No. 61/804,510, filed on Mar. 22, 2013.

(51) Int. Cl.
*H01L 45/00* (2006.01)
*H01L 27/24* (2006.01)

(52) U.S. Cl.
CPC ........ *H01L 45/1266* (2013.01); *H01L 27/2436* (2013.01); *H01L 27/2481* (2013.01); *H01L 45/085* (2013.01); *H01L 45/1226* (2013.01); *H01L 45/1233* (2013.01); *H01L 45/145* (2013.01)

(58) Field of Classification Search
CPC ..... H01L 45/08; H01L 45/085; H01L 45/145; H01L 27/2409; H01L 27/2436; G11C 13/0011
See application file for complete search history.

(56) References Cited

U.S. PATENT DOCUMENTS

| | | | | |
|---|---|---|---|---|
| 8,334,525 | B2 * | 12/2012 | Nakai et al. | 257/2 |
| 8,395,926 | B2 * | 3/2013 | Kreupl et al. | 365/148 |
| 8,724,369 | B2 * | 5/2014 | Zhang et al. | 365/148 |
| 8,860,182 | B1 * | 10/2014 | Takaishi et al. | 257/536 |
| 8,866,121 | B2 * | 10/2014 | Wang et al. | 257/4 |
| 8,895,948 | B2 * | 11/2014 | Arayashiki | 257/2 |
| 8,913,418 | B2 * | 12/2014 | Wang et al. | 365/148 |
| 2009/0014707 | A1 | 1/2009 | Lu et al. | |

(Continued)

FOREIGN PATENT DOCUMENTS

| | | |
|---|---|---|
| JP | 2009-49183 A | 3/2009 |
| JP | 2012-43896 A | 3/2012 |

(Continued)

OTHER PUBLICATIONS

U.S. Appl. No. 14/022,732, filed Sep. 10, 2013, Ishikawa et al.

*Primary Examiner* — Allison P Bernstein
(74) *Attorney, Agent, or Firm* — Oblon, McClelland, Maier & Neustadt, L.L.P.

(57) ABSTRACT

A resistance random access memory device according an embodiment includes a first electrode, a second electrode and a resistance change layer. The first electrode includes a metal. The resistance change layer is provided between the first electrode and the second electrode. One of the metal is able to reversibly move within the resistance change layer. The second electrode is formed of a material ionizing less easily than the metal. The resistance change layer contains silicon, oxygen, and nitrogen, a nitrogen concentration of the resistance change layer is less than 46 atomic % and not less than 20 atomic %.

14 Claims, 14 Drawing Sheets

(56) References Cited

U.S. PATENT DOCUMENTS

| | | |
|---|---|---|
| 2010/0085798 A1 | 4/2010 | Lu et al. |
| 2010/0102290 A1 | 4/2010 | Lu et al. |
| 2012/0043517 A1 | 2/2012 | Sonehara |
| 2013/0313508 A1* | 11/2013 | Kawasaki .................. 257/4 |
| 2014/0063903 A1* | 3/2014 | Chang et al. .................. 365/148 |

FOREIGN PATENT DOCUMENTS

| | | |
|---|---|---|
| JP | 2012-174754 A | 9/2012 |
| WO | WO 2012/111205 A1 | 8/2012 |

\* cited by examiner

RESISTANCE RANDOM ACCESS MEMORY DEVICE

CROSS-REFERENCE TO RELATED APPLICATIONS

This application is based upon and claims the benefit of priority from U.S. Provisional Patent Application 61/804,510, filed on Mar. 22, 2013; the entire contents of which are incorporated herein by reference.

FIELD

Embodiments described herein relate generally to a resistance random access memory device.

BACKGROUND

In recent years, two-terminal nonvolatile resistance change memory devices that are typified by ReRAM (Resistive Random Access Memory) are developed. Such a memory device is considered to be advantageous for low voltage operations, high speed switching, and downscaling. Therefore, such a memory device is a candidate for a next-generation large-capacity memory device to replace floating-gate type NAND flash memory.

DETAILED DESCRIPTION

A resistance random access memory device according an embodiment includes a first electrode, a second electrode and a resistance change layer. The first electrode includes a metal. The resistance change layer is provided between the first electrode and the second electrode. One of the metal is able to reversibly move within the resistance change layer. The second electrode is formed of a material ionizing less easily than the metal. The resistance change layer contains silicon, oxygen, and nitrogen, a nitrogen concentration of the resistance change layer is less than 46 atomic % and not less than 20 atomic %.

Embodiments of the invention will now be described with reference to the drawings.

First Embodiment

[1] Configuration

First, the configuration of a memory element of the embodiment will be described.

Figure 1:
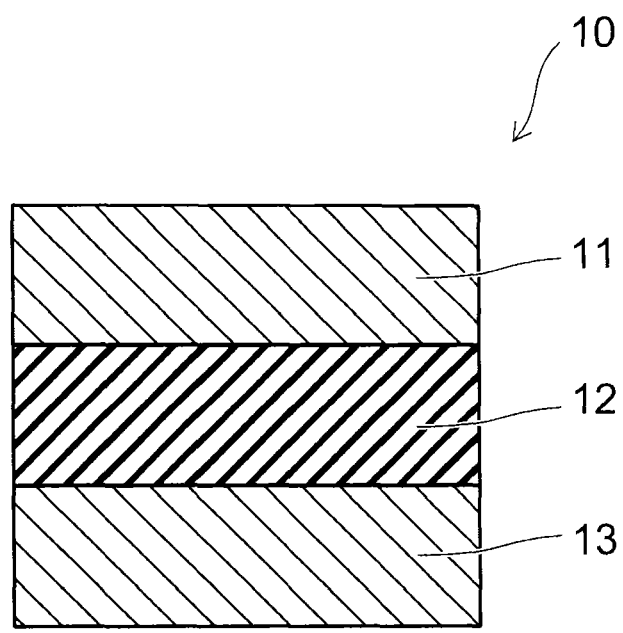
FIG. 1 is a cross-sectional view showing the memory element of a nonvolatile resistance random access memory device according to a first embodiment.

FIG. 1 is a cross-sectional view showing the memory element of a nonvolatile resistance random access memory device according to the embodiment.

As shown in FIG. 1, an ion source electrode 11, a resistance change layer 12, and an opposing electrode 13 are stacked in this order in a memory element 10 of the nonvolatile resistance random access memory device (hereinbelow, also called simply the "device") according to the embodiment.

The ion source electrode 11 is formed of a metal or a conductive material including a metal that is ionized by applying an electric field such that the ions are capable of entering the resistance change layer 12. For example, the ion source electrode 11 is formed of silver (Ag). However, the material of the ion source electrode 11 is not limited to silver and may be, for example, at least one type of metal selected from the group consisting of silver (Ag), copper (Cu), zinc (Zn), gold (Au), titanium (Ti), nickel (Ni), cobalt (Co), tantalum (Ta), aluminum (Al), and bismuth (Bi) or an alloy or silicide including the at least one type of metal.

The opposing electrode 13 is formed of a conductive material that ionizes less easily than the material of the ion source electrode 11. For example, the opposing electrode 13 is formed of silicon (Si) into which an impurity is introduced. More specifically, the opposing electrode 13 is formed of, for example, p-type silicon doped with boron (B) at a high concentration such that the resistivity is not more than 0.005 Ωcm. However, the material of the opposing electrode 13 is not limited to silicon that is doped with boron and, for example, may be n-type silicon doped with arsenic (As) or phosphorus (P), may be a metal such as titanium (Ti), tungsten (W), tantalum (Ta), or the like or a carbide or nitride of such a metal, or may be a conductive material or silicide including a metal such as platinum (Pt), gold (Au), iridium (Ir), ruthenium (Ru), rhodium (Rh), palladium (Pd), molybdenum (Mo), etc.

The resistance change layer 12 is formed of silicon oxynitride (SiON). The nitrogen concentration of the resistance change layer 12 is less than 46 atomic % and not less than 20 atomic %. It is favorable for the thickness of the resistance change layer 12 to be not less than 2 nm and not more than 5 nm.

[2] Manufacturing for Method

A method for manufacturing the memory element of the embodiment will now be described.

As shown in FIG. 1, boron (B) is ion-implanted into a monocrystalline silicon substrate using, for example, an acceleration voltage of 30 keV and a dose of $2 \times 10^{15}$ cm$^{-2}$. Then, the boron that is implanted is activated by performing activation annealing. Thereby, the p-type region of the monocrystalline silicon substrate is used as the opposing electrode 13. The opposing electrode 13 may be formed by depositing a silicon layer in which boron is doped at a high concentration on a semiconductor substrate made of silicon with a thickness of, for example, about 20 nm by CVD (chemical vapor deposition). The thickness of the opposing electrode 13 in such a case is typically 5 to 200 nm.

Then, silicon oxynitride is deposited on the opposing electrode 13 by, for example, CVD. For example, the silicon oxynitride is formed at a film formation temperature of 250° C. by PE-CVD (plasma-enhanced chemical vapor deposition). Thereby, the resistance change layer 12 is formed.

Then, the ion source electrode 11 is formed by, for example, depositing silver on the resistance change layer 12 by sputtering or vapor deposition. Thus, the memory element 10 shown in FIG. 1 is made.

[3] Operations and Effects

Operations and effects of the embodiment will now be described.

Figure 2A:
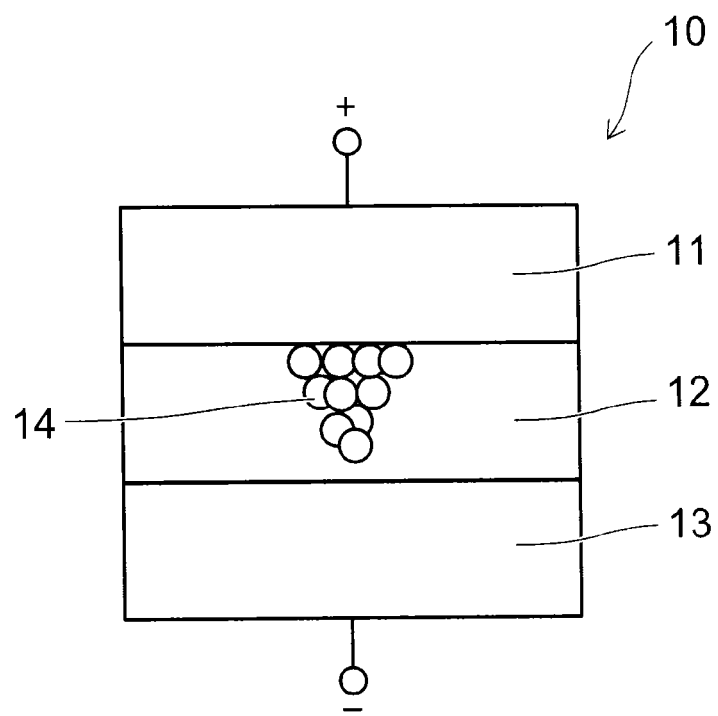
FIG. 2A and FIG. 2B are cross-sectional views schematically showing the operations of the memory element of the first embodiment.
Figure 2B:
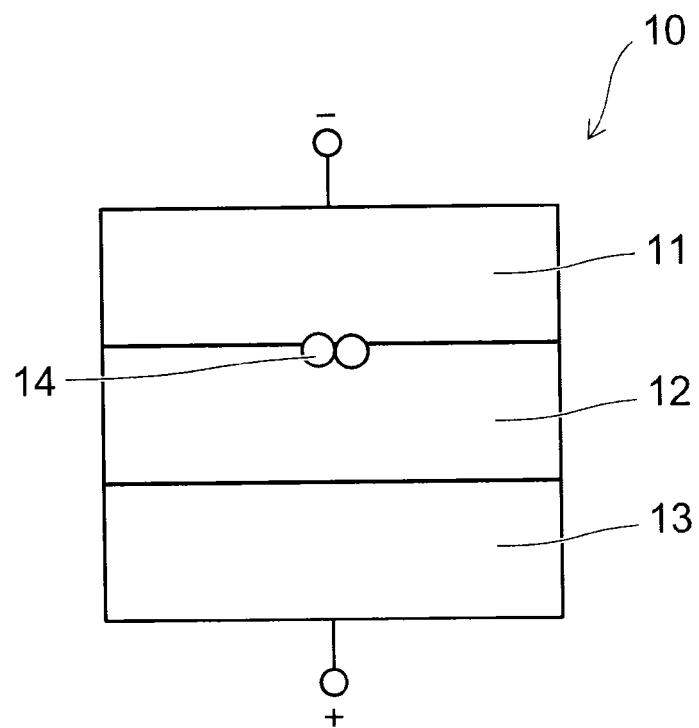

FIG. 2A and FIG. 2B are cross-sectional views schematically showing the operations of the memory element of the embodiment.

As shown in FIG. 2A, when a positive voltage is applied to the memory element 10 to cause the ion source electrode 11 to become positive and the opposing electrode 13 to become negative, the silver atoms of the ion source electrode 11 are ionized and move through the resistance change layer 12 toward the opposing electrode 13 which is negative due to the electric field. Then, these combine with electrons supplied from the opposing electrode 13 and precipitate inside the resistance change layer 12. Thereby, a conduction path made of silver is formed inside the resistance change layer 12 to pierce the resistance change layer 12 from the ion source electrode 11 to the opposing electrode 13. Hereinbelow, the conduction path is called a filament 14. By the filament 14 being formed, the electrical resistance value of the resistance change layer 12 between the ion source electrode 11 and the opposing electrode 13 decreases; and the state is switched to the "low resistance state." This operation is called "setting;" and the positive voltage that is applied at this time is called the "set voltage."

On the other hand, as shown in FIG. 2B, when a negative voltage is applied to the memory element 10 to cause the ion source electrode 11 to become negative and the opposing electrode 13 to become positive, the silver atoms of the filament 14 are ionized and move toward the ion source electrode 11 due to the electric field. Then, these combine with electrons inside the ion source electrode 11 and again become silver atoms. Thereby, at least a portion of the filament 14 disappears; and the electrical resistance value of the resistance change layer 12 increases. As a result, the state returns to the "high resistance state." This operation is called "resetting;" and the negative voltage that is applied at this time is called the "reset voltage."

Thus, reversible control of the "low resistance state" and the "high resistance state" is possible by the polarity of the programming voltage applied to the memory element 10. Usage as a memory is possible by associating the high resistance state with the off-state and the low resistance state with the on-state, reading the magnitude of a read-out current flowing through the memory element 10 when some read-out voltage is applied, and discriminating between the on-state and the off-state. The resistance state of the memory element 10 does not change due to the read-out operation because the read-out voltage to sense the resistance state of the memory element 10 is low compared to the programming voltage for switching the memory element 10 to the low resistance state or the high resistance state. Thus, a nonvolatile memory can be realized because the transition between the "high resistance state" and the "low resistance state" occurs only when the programming voltage is applied.

A retention characteristic of the low resistance state will now be described.

Even in the case where the memory element 10 shown in FIG. 2A and FIG. 2B is switched once to the low resistance state by forming the filament 14, the atoms of the filament 14 diffuse over time; and the filament 14 gradually becomes fine and finally breaks. Therefore, when a prescribed read-out voltage is applied to the memory element 10, the read-out current (the on-state current) decreases over time; and finally, the on-state current and the off-state current unfortunately can no longer be discriminated. However, in practice, it is possible to be treated as a nonvolatile memory if the time for the on-state current to decrease to a level that cannot be discriminated from the off-state current is not less than a prescribed guarantee time.

Figure 3:
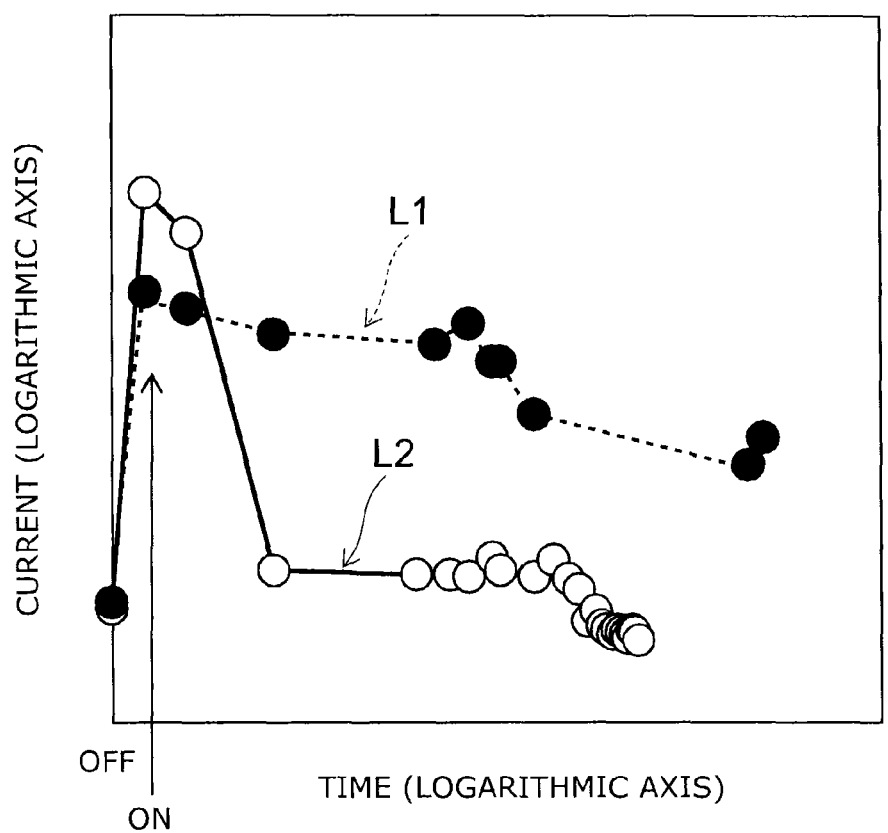
FIG. 3 is a graph showing retention characteristics of the on-state current of the memory element, where the horizontal axis is time, and the vertical axis is the on-state current.

FIG. 3 is a graph showing retention characteristics of the on-state current of the memory element, where the horizontal axis is time, and the vertical axis is the on-state current.

The broken line L1 shown in FIG. 3 illustrates a memory element in which the nitrogen concentration inside the silicon oxynitride of the resistance change layer 12 is 26 atomic %; and the solid line L2 illustrates a memory element in which the nitrogen concentration is 9 atomic %. The retention characteristic of the on-state current of the memory element in which the nitrogen concentration inside the silicon oxynitride is 26 atomic % is markedly superior to the retention characteristic of the on-state current of the memory element in which the nitrogen concentration is 9 atomic %.

Figure 4:
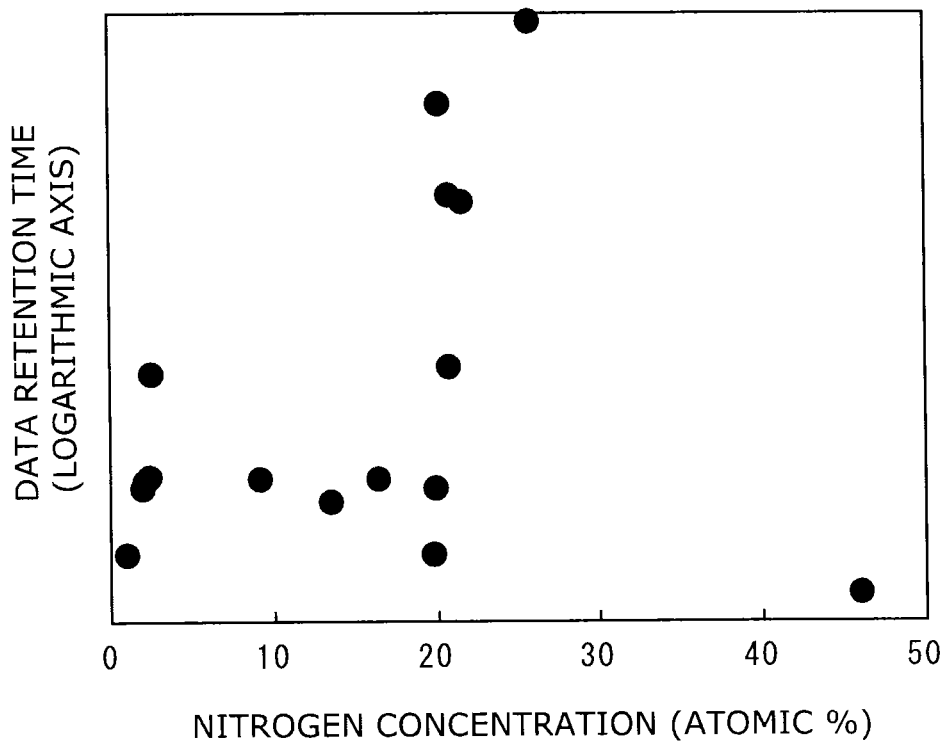
FIG. 4 is a graph showing the effects of the nitrogen concentration on the data retention time, where the horizontal axis is the nitrogen concentration inside the resistance change layer that is made of silicon nitride, and the vertical axis is the data retention time.

FIG. 4 is a graph showing the effects of the nitrogen concentration on the data retention time, where the horizontal axis is the nitrogen concentration inside the resistance change layer that is made of silicon nitride, and the vertical axis is the data retention time.

The "data retention time" is the time for the change rate of the on-state current to reach a prescribed reference after the memory element is once switched to the low resistance state. That is, the temporal change of the on-state current is small in a memory element for which the data retention time is long.

As shown in FIG. 4, a boundary exists in the nitrogen concentration where the data retention time increases; and although the nitrogen concentration substantially does not change from 0 atomic % to 20 atomic %, the data retention time increases abruptly when the nitrogen concentration becomes 20 atomic % or more. On the other hand, the data retention time decreases when the nitrogen concentration becomes 46 atomic %. Therefore, the data retention time lengthens when the nitrogen concentration inside the silicon oxynitride of the resistance change layer 12 is in a range that is less than 46 atomic % and not less than 20 atomic %. The composition of the silicon oxynitride is analyzable by, for example, XPS (X-ray photoelectron spectroscopy), TEM (transmission electron microscopy)-EDX (energy dispersive X-ray spectroscopy), etc.

Also, it is favorable for the thickness of the resistance change layer 12 to be not less than 2 nm and not more than 5 nm. This is because, in the case where the thickness of the resistance change layer 12 is less than 2 nm, the electrical resistance value of the resistance change layer 12 itself between the ion source electrode 11 and the opposing electrode 13 decreases too much; and, for example, it becomes difficult to operate in a nanoampere-order small current region. On the other hand, in the case where the thickness of the resistance change layer 12 is thicker than 5 nm, it becomes difficult to set the memory element 10 because the distance that the ions of the metal of the ion source electrode 11 must move to form the filament 14 inside the resistance change layer 12 lengthens and the necessary energy increases. Thus, although the favorable range of the thickness of the resistance change layer 12 depends on the composition and resistance value of the resistance change layer 12, it is favorable for the thickness to be, for example, not less than 2 nm and not more than 5 nm.

As described above, according to the embodiment, a nonvolatile resistance change memory element having a good retention characteristic of the low resistance state can be realized by controlling the nitrogen concentration inside the silicon oxynitride of the resistance change layer.

Second Embodiment

[1] Configuration

First, the configuration of a memory element of the embodiment will be described.

Figure 5:
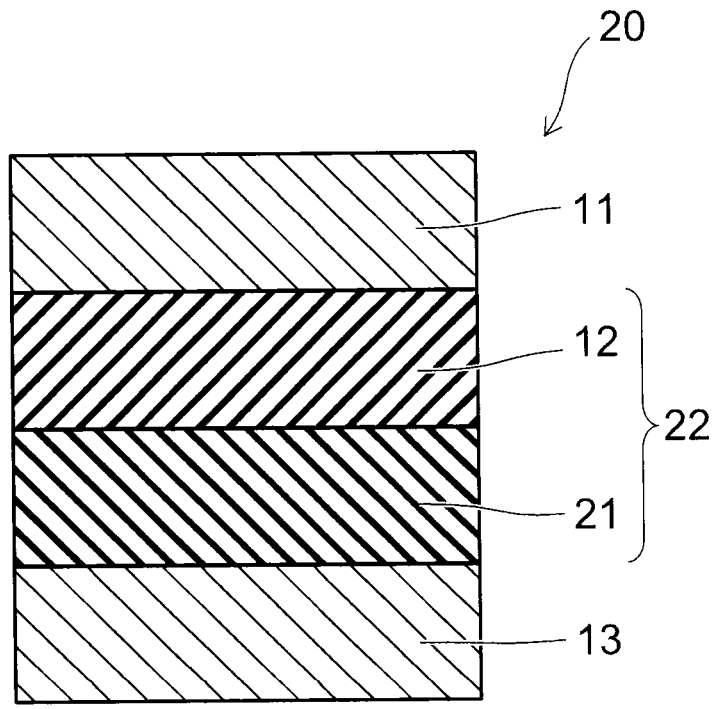
FIG. 5 is a cross-sectional view showing the memory element of the nonvolatile resistance random access memory device according to a second embodiment.

FIG. 5 is a cross-sectional view showing the memory element of the nonvolatile resistance random access memory device according to the embodiment.

As shown in FIG. 5, in addition to the configuration of the memory element 10 (referring to FIG. 1) of the first embodiment described above, a rectifying layer 21 is provided between the resistance change layer 12 and the opposing electrode 13 in the memory element 20 of the embodiment. A stacked film 22 is formed of the resistance change layer 12 and the rectifying layer 21. The configurations of the ion source electrode 11, the resistance change layer 12, and the opposing electrode 13 are similar to those of the first embodiment described above. Namely, the resistance change layer 12 is formed of silicon oxynitride having a nitrogen concentration less than 46 atomic % and not less than 20 atomic %.

The rectifying layer 21 is formed of a material such that the resistivity of the material is higher than that of the material of the ion source electrode 11 and that of the material of the opposing electrode 13, the filament 14 can be formed of the metal of the ion source electrode 11 in the interior of the material, and the diffusion coefficient of the metal of the filament 14 in the material is higher than the diffusion coefficient of the metal of the filament 14 in the resistance change layer 12. Thereby, the filament 14 forms and decomposes more easily inside the rectifying layer 21 than inside the resistance change layer 12. For example, the rectifying layer 21 is formed of silicon oxynitride having a nitrogen concentration that is less than 20 atomic % or not less than 46 atomic %, silicon nitride, silicon oxide, or amorphous silicon. Also, it is favorable for the thickness of the rectifying layer 21 to be not more than the thickness of the resistance change layer 12. The rectifying layer 21 is formed to obtain a difference of the read-out current of not less than 10 times due to the existence/absence of the filament 14.

[2] Manufacturing Method

A method for manufacturing the memory element of the embodiment will now be described.

First, as shown in FIG. 5, the opposing electrode 13 is formed using methods similar to those of the first embodiment described above.

Then, amorphous silicon is deposited on the opposing electrode 13 by, for example, CVD. The deposition is implemented by, for example, plasma CVD at a film formation temperature of 250° C. Thereby, the rectifying layer 21 is formed on the opposing electrode 13.

Then, by methods similar to those of the first embodiment described above, the resistance change layer 12 is formed on the rectifying layer 21; and the ion source electrode 11 is formed on the resistance change layer 12. Thus, the memory element 20 shown in FIG. 5 is made.

[3] Operations and Effects

Operations and effects of the embodiment will now be described.

FIG. 6A to FIG. 6D are cross-sectional views schematically showing the operations of the memory element of the embodiment.

Figures 6A, 6B:
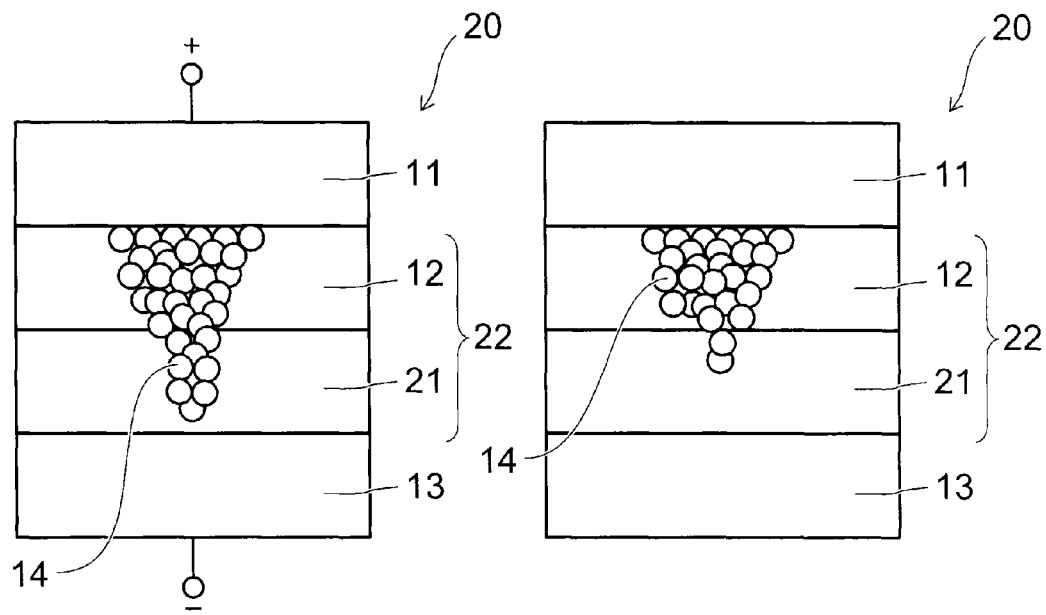
FIG. 6A to FIG. 6D are cross-sectional views schematically showing the operations of the memory element of the second embodiment.

First, as shown in FIG. 6A, a positive voltage (the set voltage) is applied to the memory element 20 to cause the ion source electrode 11 to become positive and the opposing electrode 13 to become negative. Thereby, the metal atoms, e.g., the silver atoms, included in the ion source electrode 11 are ionized and move toward the opposing electrode 13 due to the electric field; and the filament 14 is formed inside the resistance change layer 12 and the rectifying layer 21. Thereby, the memory element 20 is switched to the low resistance state.

Subsequently, as shown in FIG. 6B, because the diffusion coefficient of the metal, e.g., the silver, of the filament 14 is higher in the material of the rectifying layer 21 than in the material of the resistance change layer 12, the filament 14 decomposes more rapidly inside the rectifying layer 21 than inside the resistance change layer 12. Therefore, after a constant amount of time has elapsed after the memory element 20 is switched to the low resistance state, the memory element 20 switches to a state in which the filament 14 inside the rectifying layer 21 disappears and the filament 14 inside the resistance change layer 12 remains. In this state, even when a negative voltage having a magnitude that is about the magnitude of the read-out voltage is applied, the magnitude of the current that flows in the memory element 20 approaches that of the off-state current because the filament 14 is not formed inside the rectifying layer 21.

Figures 6C, 6D:
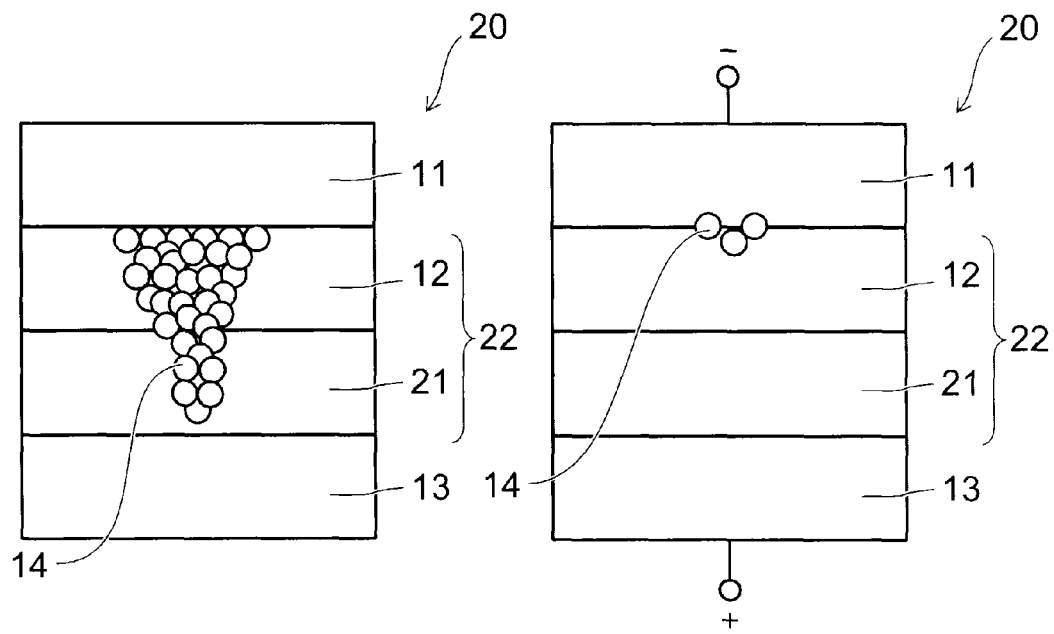

On the other hand, as shown in FIG. 6C, when the positive read-out voltage is applied to the memory element 20 in the state shown in FIG. 6B, the filament 14 is formed again inside the rectifying layer 21; and the memory element 20 returns to the low resistance state. At this time, it is possible to form the filament 14 inside the rectifying layer 21 by a voltage (the read-out voltage) that is lower than the positive voltage (the programming voltage) that is necessary to form the filament 14 inside the resistance change layer 12 because the diffusion coefficient of silver is higher in the rectifying layer 21 than in the resistance change layer 12. Therefore, by applying the positive read-out voltage to the memory element 20 in the state shown in FIG. 6B, the on-state current flows; and the memory element 20 can be identified as being in the low resistance state.

Further, as shown in FIG. 6D, when the negative programming voltage (the reset voltage) is applied to the memory element 20, the filament 14 disappears in both the resistance change layer 12 and the rectifying layer 21; and the state returns to the high resistance state.

Thus, by providing the rectifying layer 21 other than the resistance change layer 12 such that the filament 14 forms and disappears more easily in the rectifying layer 21 than in the resistance change layer 12, for the low resistance state in which the filament 14 is formed inside the resistance change layer 12, it is possible for the on-state current to be caused to flow when the read-out voltage that is positive is applied and for the on-state current to not flow when the read-out voltage that is negative is applied. Thereby, the memory element 20 can have a rectifying function.

Otherwise, the configuration, the manufacturing method, the operations, and the effects of the embodiment are similar to those of the first embodiment described above.

Third Embodiment

FIG. 7A to FIG. 7D are cross-sectional views schematically showing the operations of a memory element of the embodiment.

Figure 7A:
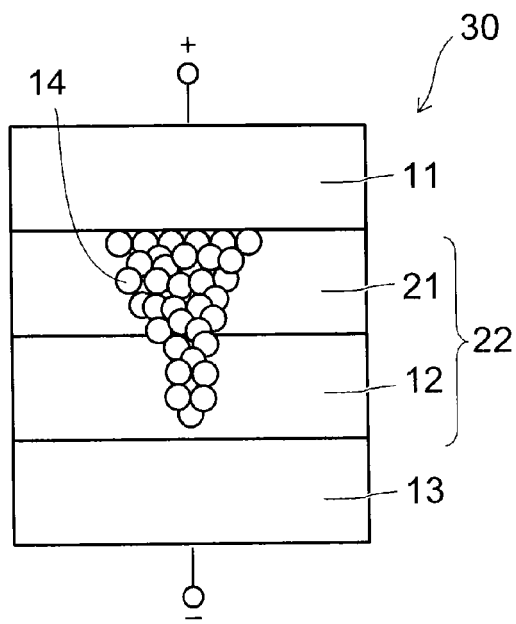
FIG. 7A to FIG. 7D are cross-sectional views schematically showing the operations of a memory element of a third embodiment.
Figure 7B:
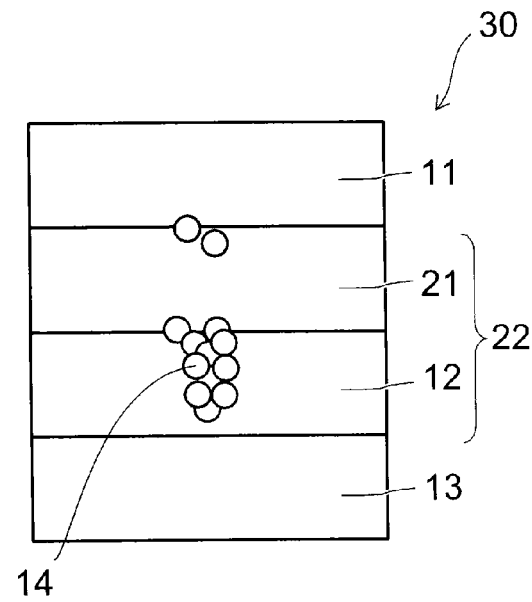
Figure 7C:
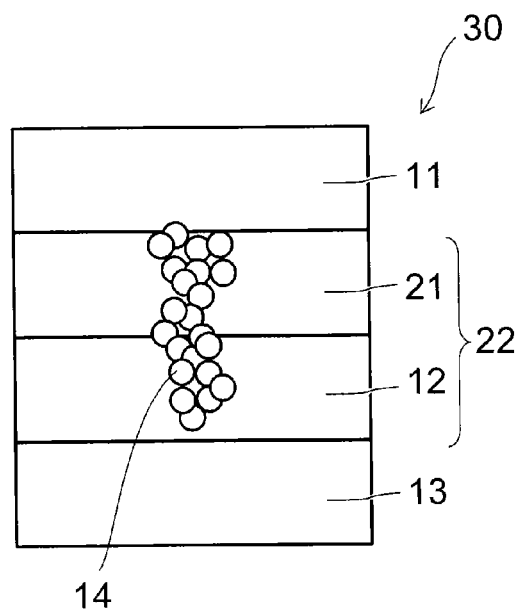
Figure 7D:
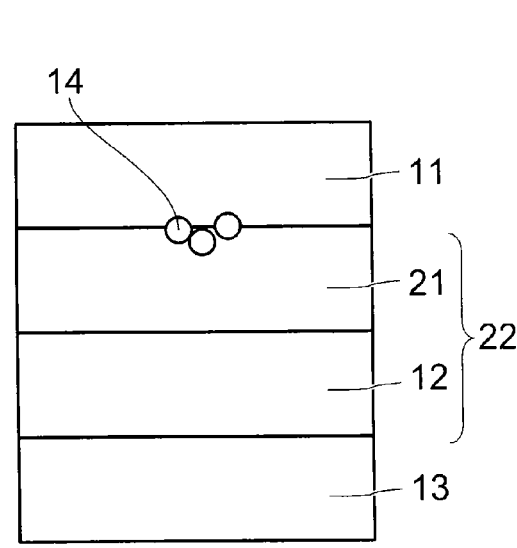

As shown in FIG. 7A to FIG. 7D, compared to the memory element 20 (referring to FIG. 5) according to the second embodiment described above, the stacking order of the resistance change layer 12 and the rectifying layer 21 is reversed in the memory element 30 of the embodiment. In other words, the opposing electrode 13, the resistance change layer 12, the rectifying layer 21, and the ion source electrode 11 are stacked in this order. The ion source electrode 11 contacts the rectifying layer 21. As shown in FIG. 7B, after a constant amount of time has elapsed after the memory element 20 is switched to the low resistance state, the filament 14 is remained in the resistance change layer 12 and isolated from the source electrode 11. As shown in FIG. 7C, when the positive read-out voltage is applied to the memory element 20 in the state shown in FIG. 7B, the filament 14 contacts to the source electrode 11.

According to the embodiment as well, effects similar to those of the second embodiment described above can be obtained. Otherwise, the configuration, the manufacturing method, and the operations of the embodiment are similar to those of the second embodiment described above.

Fourth Embodiment

[1] Configuration

In the embodiment, a cross-point resistance random access memory device is described in which the memory element described in the first to third embodiments described above is disposed at the intersections between bit lines and word lines.

Figure 8A:
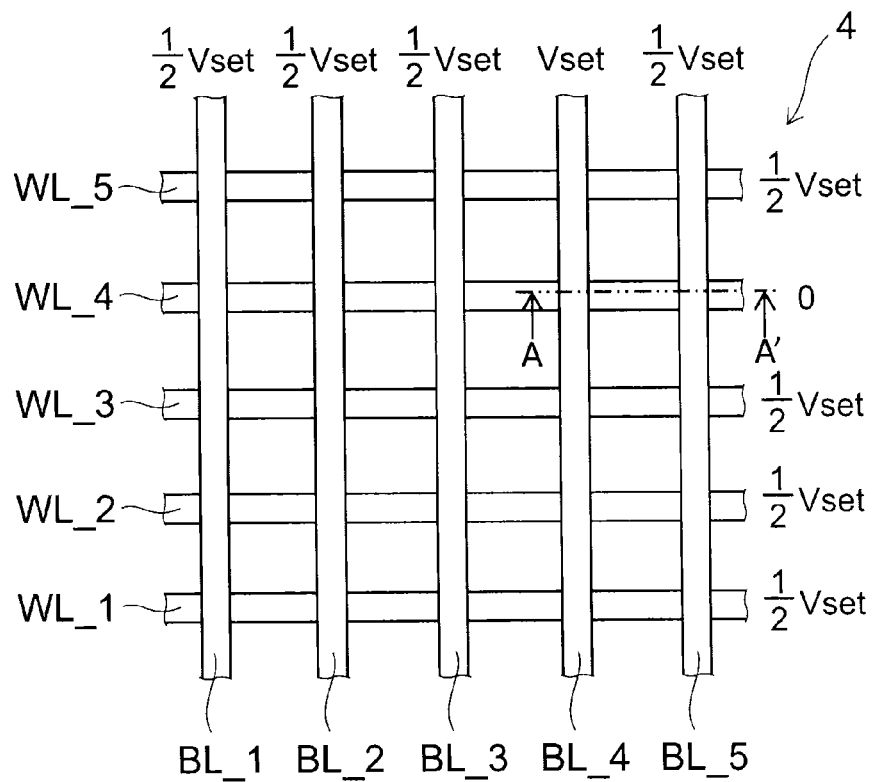
FIG. 8A is a plan view showing the resistance random access memory device according to a fourth embodiment.
Figure 8B:
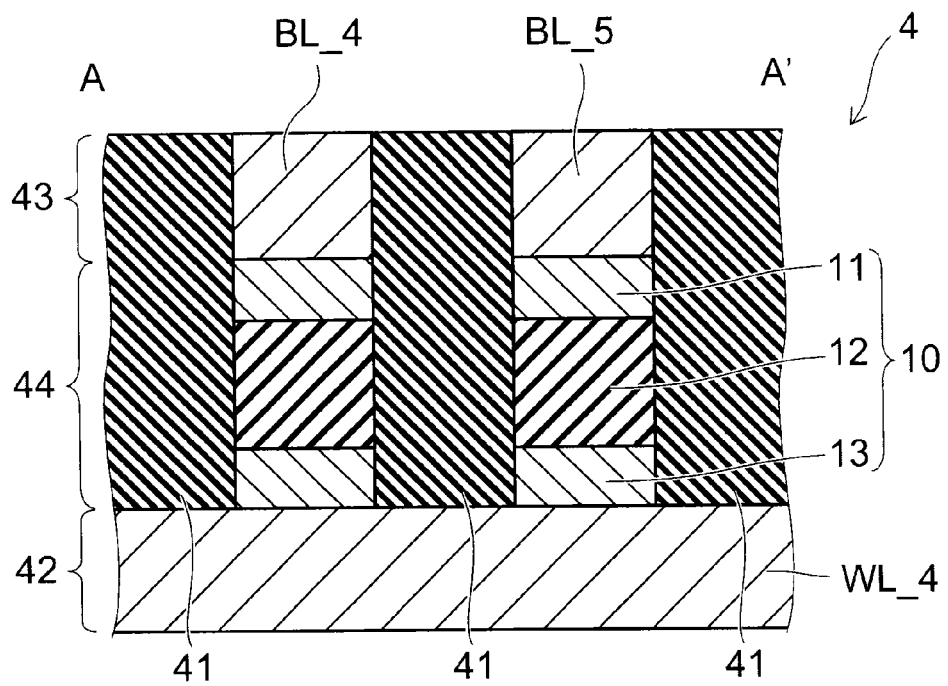
FIG. 8B is a cross-sectional view along line A-A' of FIG. 8A.

FIG. 8A is a plan view showing the resistance random access memory device according to the embodiment; and FIG. 8B is a cross-sectional view along line A-A' of FIG. 8A.

In the resistance random access memory device 4 according to the embodiment as shown in FIG. 8A and FIG. 8B, a word line interconnect layer 42, a memory array layer 44, and a bit line interconnect layer 43 are stacked in this order. In the word line interconnect layer 42, multiple word lines WL_1 to WL_5 (hereinbelow, also generally referred to as the "word lines WL") that extend in one direction are arranged at uniform spacing; and an inter-layer insulating film 41 is filled between the word lines WL. In the bit line interconnect layer 43, multiple bit lines BL_1 to BL_5 (hereinbelow, also generally referred to as the "bit lines BL") that extend in a direction that crosses, e.g., is orthogonal to, the direction in which the word lines WL extend are arranged at uniform spacing; and the inter-layer insulating film 41 is filled between the bit lines BL. The multiple memory elements 10 are arranged in a matrix configuration in the memory array layer 44.

Although only five word lines WL and five bit lines BL are shown for convenience of illustration in FIG. 8A, actually, more word lines WL and bit lines BL exist. Moreover, the components other than the word lines WL and the bit lines BL are not shown in FIG. 8A.

The memory element 10 is provided at the most proximal portion between each of the word lines WL and each of the bit lines BL. The configuration of the memory element 10 is as described in the first embodiment described above. In each of the memory elements 10, the ion source electrode 11 is disposed on the bit line BL side; and the opposing electrode 13 is disposed on the word line WL side. The inter-layer insulating film 41 is filled between the memory elements 10. Instead of the memory element 10, the memory element 20 described in the second embodiment described above or the memory element 30 described in the third embodiment described above may be provided.

The inter-layer insulating film 41 is formed of, for example, an insulating material having a retention characteristic of the filament 14 that is lower than that of the material of the resistance change layer 12. For example, in the case where the ion source electrode 11 is formed of silver, the diffusion coefficient of silver in the inter-layer insulating film 41 is higher than the diffusion coefficient of silver in the resistance change layer 12. For example, the inter-layer insulating film 41 is formed of silicon nitride, amorphous silicon, silicon oxide, or silicon oxynitride having a nitrogen concentration that is less than 20 atomic % or greater than 46 atomic %.

[2] Operations and Effects

Figure 9A:
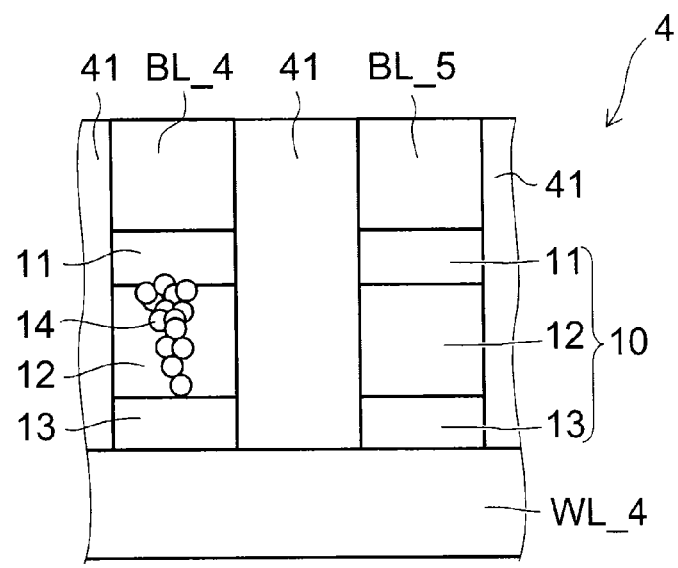
FIG. 9A to FIG. 9C are cross-sectional views schematically showing the operations of the resistance random access memory device according to the fourth embodiment.
Figure 9B:
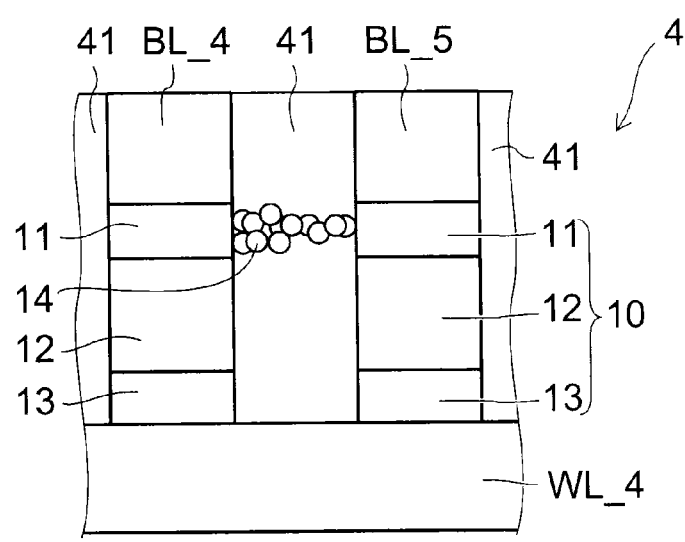
Figure 9C:
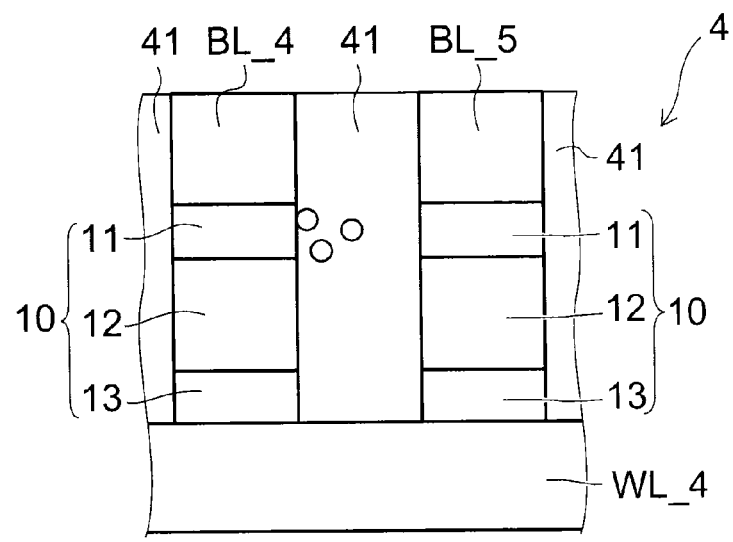

FIG. 9A to FIG. 9C are cross-sectional views schematically showing the operations of the resistance random access memory device according to the embodiment.

As shown in FIG. 8A and FIG. 9A, in the case where a set operation in which the memory element 10 connected between the bit line BL_4 and the word line WL_4 is the selected cell is performed, a potential Vset is applied to the bit line BL_4; a potential (½)Vset is applied to the bit lines BL other than the bit line BL_4; a potential 0 (zero) is applied to the word line WL_4; and the potential (½)Vset is applied to the word lines WL other than the word line WL_4. Thereby, a positive voltage having a magnitude of Vset is applied to the selected cell; and the set operation is performed. On the other hand, the set operation is not performed for the other memory elements 10 because a positive voltage having a magnitude of 0 (zero) or (½)Vset is applied to the other memory elements 10.

However, in the case where, for example, the rectifying layer 21 is provided in the memory element as described in the second or third embodiment described above, the film thickness of the stacked film 22 is about the same as the film thickness of the inter-layer insulating film 41 in the case where the total film thickness of the stacked film 22 that is made of the resistance change layer 12 and the rectifying layer 21 is set to be 5 to 20 nm and the half pitches of the word lines WL and the bit lines BL are set to be not more than 10 nm. Then, when the potential Vset is applied to the bit line BL_4 and the potential (½)Vset is applied to the bit line BL_5 by the operation described above, a voltage having a magnitude of (½)Vset is applied between the ion source electrode 11 connected to the bit line BL_4 and the ion source electrode 11 connected to the bit line BL_5.

In such a case, when defects, etc., exist inside the inter-layer insulating film 41, the silver diffuses easily in such portions; and there are cases where the filament 14 is undesirably formed at a portion of the inter-layer insulating film 41 between the ion source electrodes 11 as shown in FIG. 9B. Once the filament 14 is formed between the mutually-adjacent ion source electrodes 11, disturbances occur undesirably during the programming operation, the read-out operation, and the erasing operation in the memory elements connected via the bit line BL or the word line WL to the memory element 10 to which such a filament 14 is connected.

Therefore, in the embodiment, the inter-layer insulating film 41 is formed of a material in which the retention characteristic of the filament 14 is low. Thereby, even in the case where the filament 14 is formed inside the inter-layer insulating film 41 as shown in FIG. 9C, the filament 14 naturally disappears. Therefore, the disturbances can be avoided for at least a portion of the memory elements 10.

It is sufficient for the material of the inter-layer insulating film 41 to be an insulating material having a decomposition rate of the filament 14 that is higher than that of the material of the resistance change layer 12. Further, an air gap may be formed instead of the inter-layer insulating film 41.

Figure 15:
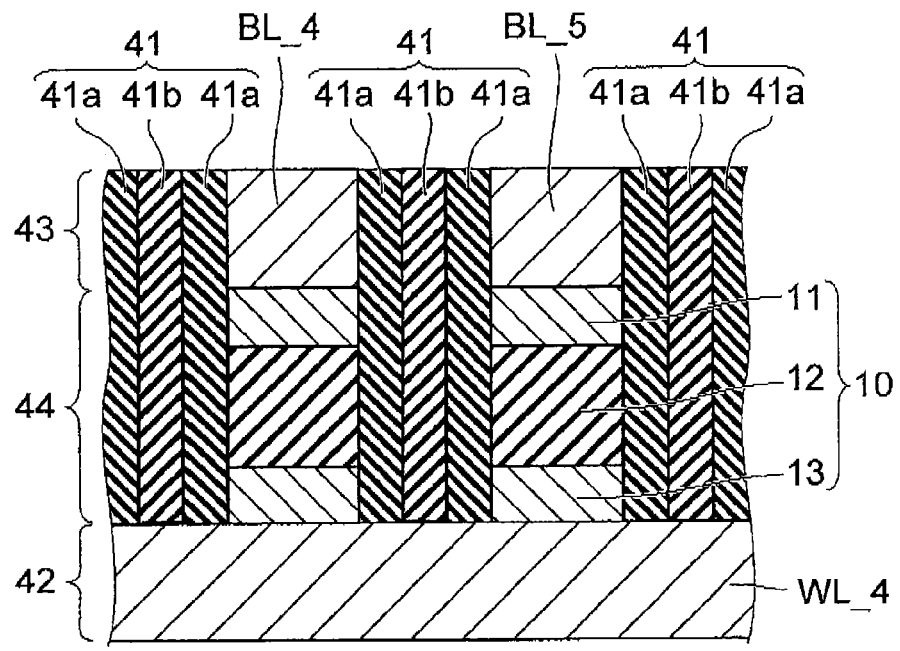
FIGS. 15-16 are cross-sectional views showing a resistance random access memory device according to a modification of the fourth embodiment.
Figure 16:
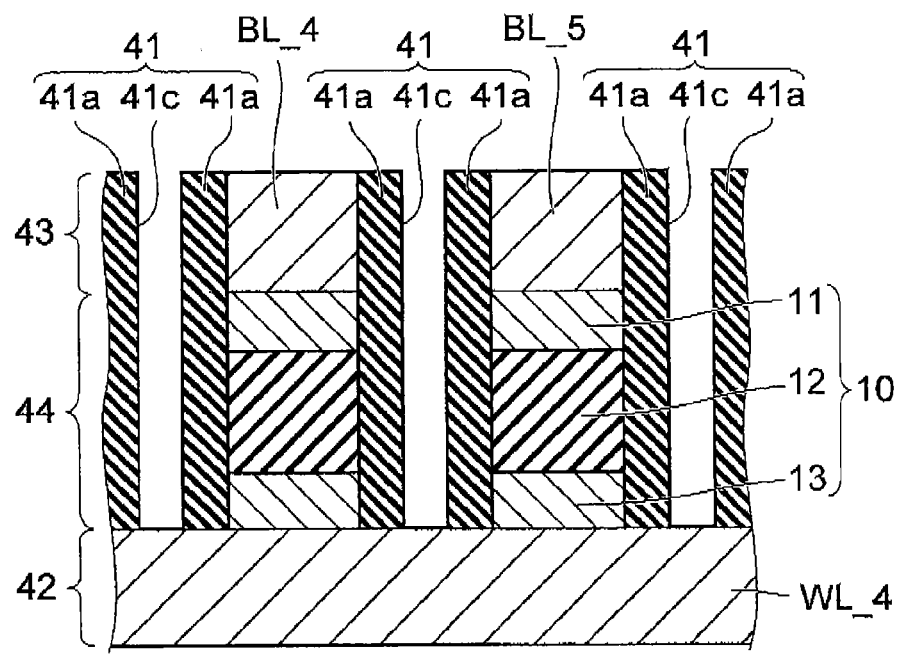

Also, the material of the inter-layer insulating film 41 may include multiple types of materials. For example, as shown in FIGS. 15 and 16, a silicon nitride film 41a having a nitrogen concentration that is less than 20 atomic % or greater than 46 atomic % may be formed as sidewalls of the memory elements; and a silicon oxide film 41b or an air gap 41c may be formed between the sidewalls.

Thus, according to the embodiment, a cross-point resistance random access memory device including a memory element having a good retention characteristic of the on-state can be realized. Also, the reliability of the switching operation of the cross-point memory device can be increased.

Otherwise, the configuration, the manufacturing method, the operations, and the effects of the embodiment are similar to those of the first embodiment described above.

In the embodiment, common use of the ion source electrode 11 and the bit line BL is possible; and common use of the opposing electrode 13 and the word line WL is possible.

Fifth Embodiment

Figure 10:
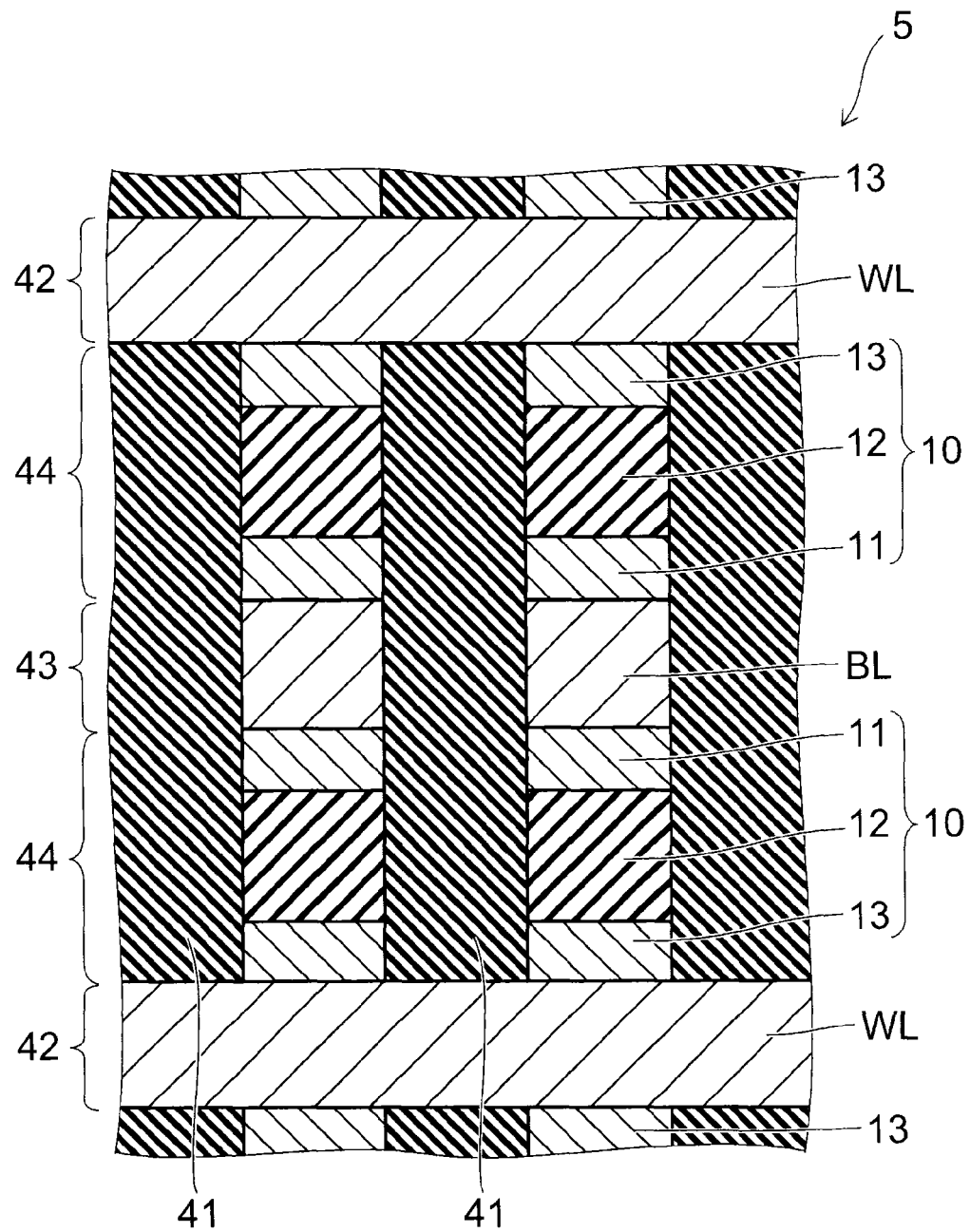
FIG. 10 is a cross-sectional view showing a resistance random access memory device according to a fifth embodiment.

FIG. 10 is a cross-sectional view showing a resistance random access memory device according to the embodiment.

In the resistance random access memory device 5 according to the embodiment as shown in FIG. 10, two or more layers of the structure shown in the fourth embodiment described above are stacked. In other words, the word line interconnect layer 42 is stacked alternately with the bit line interconnect layer 43; and the memory array layer 44 is disposed between each of the word line interconnect layers 42 and each of the bit line interconnect layers 43.

Then, the stacking order of the interior of the memory element 10 is reversed between the memory element 10 belonging to the memory array layer 44 for which the word line interconnect layer 42 is disposed below the memory array layer 44 and the bit line interconnect layer 43 is disposed above the memory array layer 44 and the memory element 10 belonging to the memory array layer 44 for which the bit line interconnect layer 43 is disposed below the memory array layer 44 and the word line interconnect layer 42 is disposed above the memory array layer 44. In other words, in each of the memory elements 10, the ion source electrode 11 is disposed on the bit line BL side; and the opposing electrode 13 is disposed on the word line WL side.

According to the embodiment, the memory element 10 can be integrated three-dimensionally.

Otherwise, the configuration, the operations, and the effects of the embodiment are similar to those of the fourth embodiment described above.

Sixth Embodiment

Figure 11:
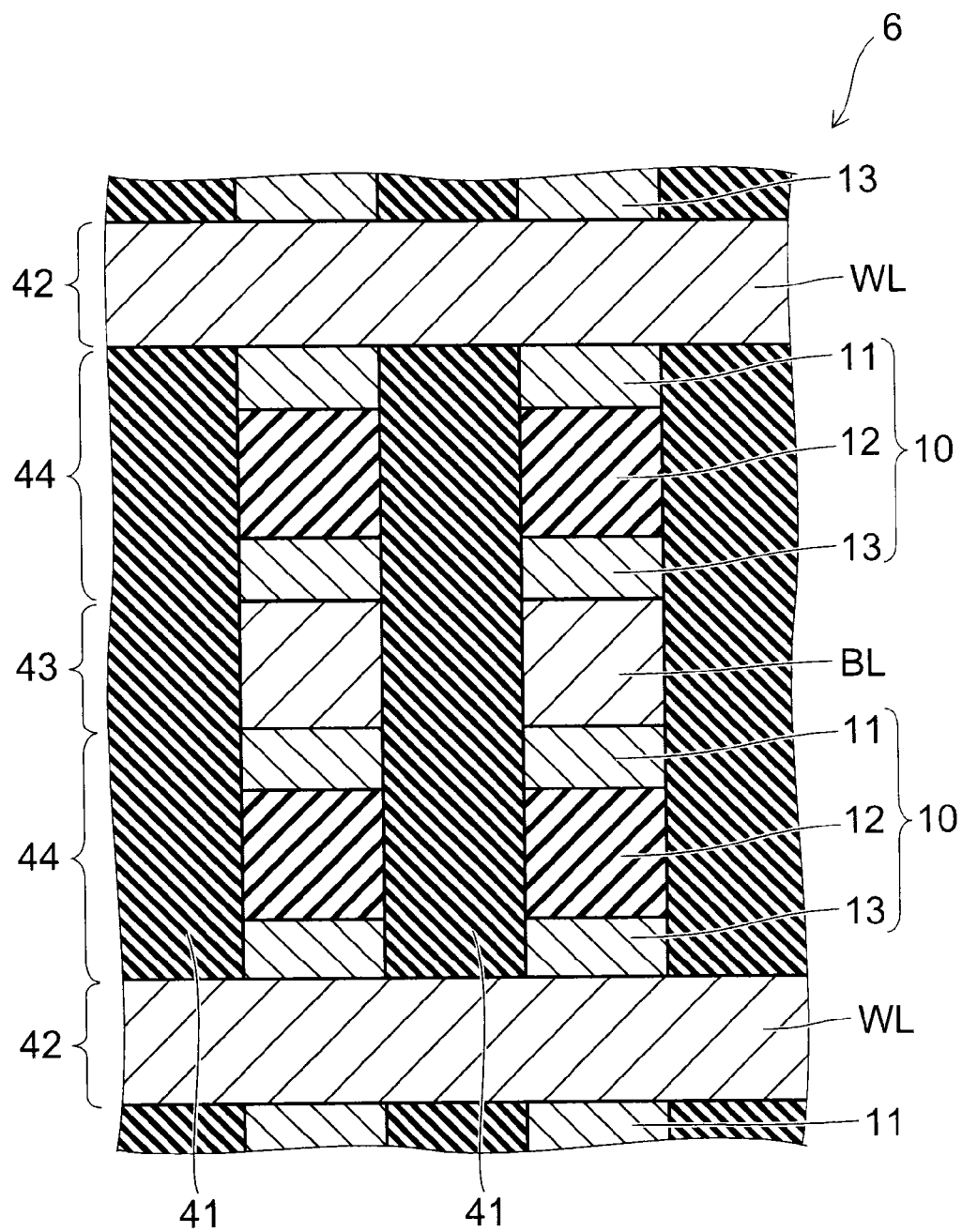
FIG. 11 is a cross-sectional view showing a resistance random access memory device according to a sixth embodiment.

FIG. 11 is a cross-sectional view showing a resistance random access memory device according to the embodiment.

As shown in FIG. 11, the resistance random access memory device 6 according to the embodiment differs from the resistance random access memory device 5 (referring to FIG. 10) according to the fifth embodiment described above in that the stacking order of the interior of the memory element 10 is the same for all of the memory elements 10.

In the device 6, the driving is performed by interchanging the roles of the word line WL and the bit line BL. In other words, at one timing of the operation, the word line WL functions as the word line and the bit line BL functions as the bit line; and at one other timing of the operation, the word line WL functions as the bit line and the bit line BL functions as the word line. For comparison with the other embodiments, the names "word line WL" and "bit line BL" are used as-is in the embodiment.

According to the embodiment, the stacking order of the memory element 10 may be common to the entire device 6. Therefore, common use of the formation process of the memory element 10 is possible; and the manufacturing of the device 6 is easier.

Otherwise, the configuration, the operations, and the effects of the embodiment are similar to those of the fifth embodiment described above.

Seventh Embodiment

Figure 12:
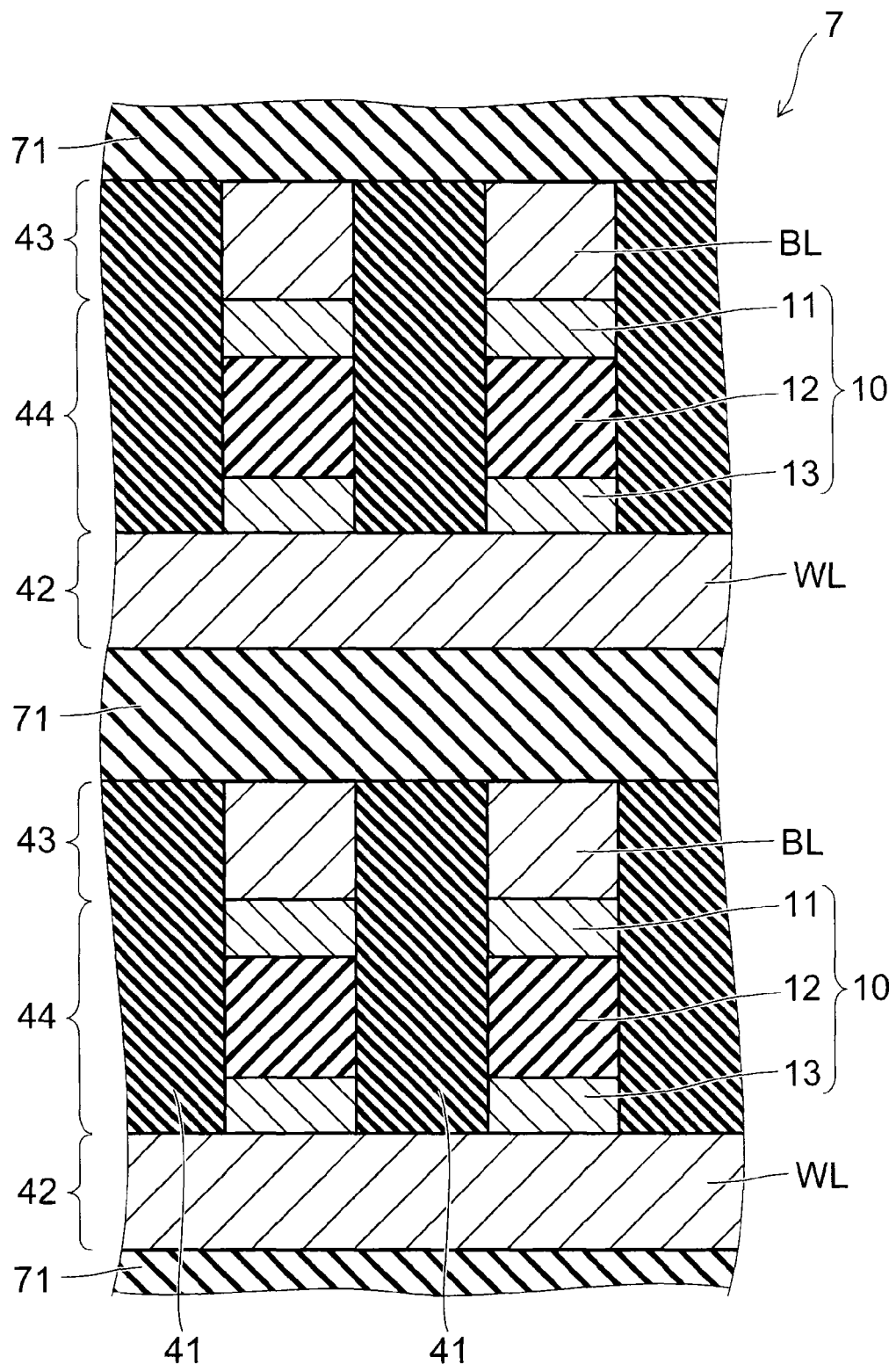
FIG. 12 is a cross-sectional view showing a resistance random access memory device according to a seventh embodiment.

FIG. 12 is a cross-sectional view showing a resistance random access memory device according to the embodiment.

As shown in FIG. 12, the resistance random access memory device 7 according to the embodiment differs from the resistance random access memory device 6 (referring to FIG. 11) according to the sixth embodiment described above in that stacked bodies made of one layer of the word line interconnect layer 42, one layer of the memory array layer 44, and one layer of the bit line interconnect layer 43 are electrically separated with an inter-layer insulating film 71 interposed.

In other words, although the memory array layer 44 exists at the position where the word line interconnect layer 42 is disposed below the position and the bit line interconnect layer 43 is disposed above the position, the memory array layer 44 does not exist and the inter-layer insulating film 71 exists at the position where the bit line interconnect layer 43 is disposed below the position and the word line interconnect layer 42 is disposed above the position.

According to the embodiment, the method for driving the device 7 is simpler than the sixth embodiment described above.

Otherwise, the configuration, the operations, and the effects of the embodiment are similar to those of the sixth embodiment described above.

Eighth Embodiment

Figure 13:
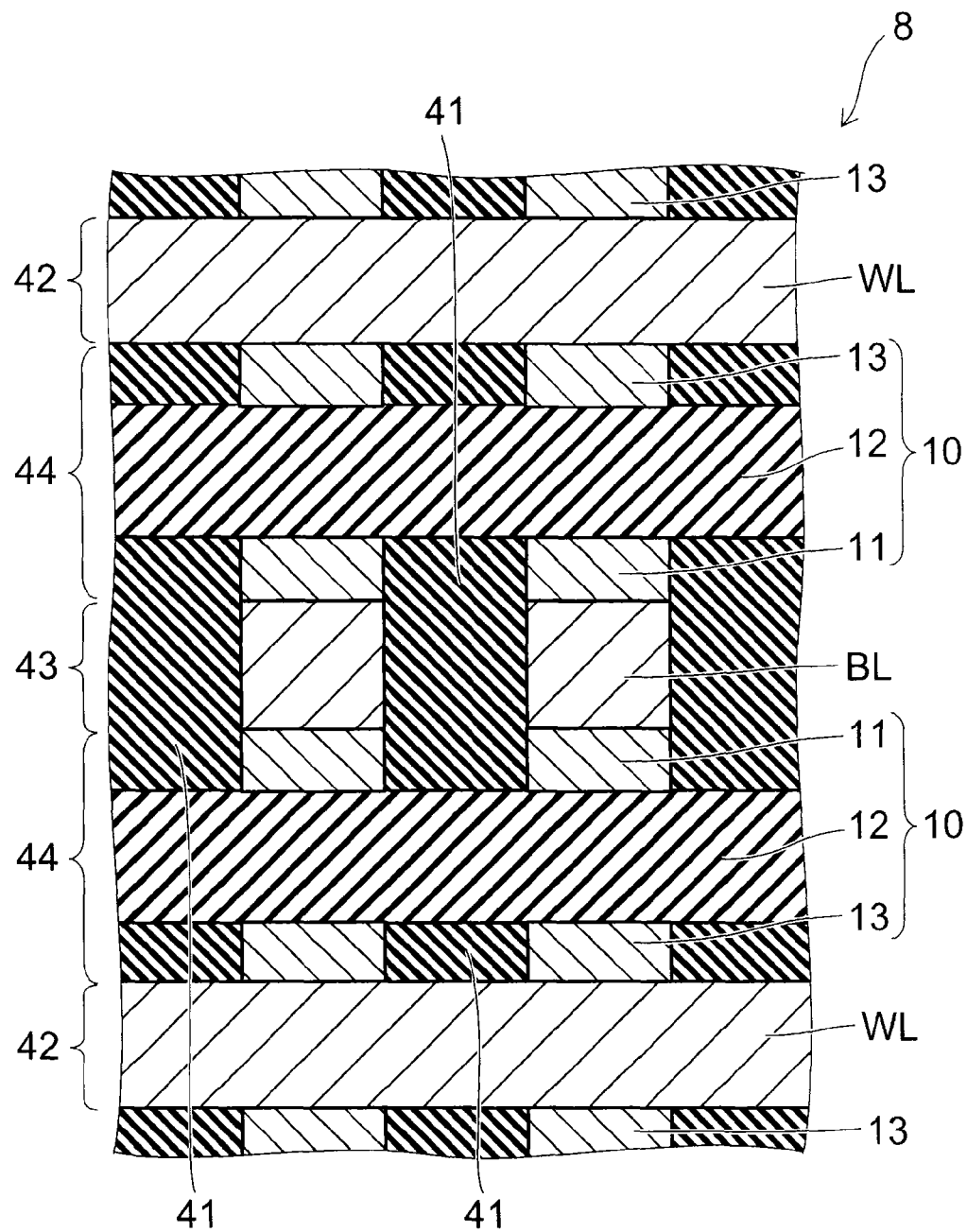
FIG. 13 is a cross-sectional view showing a resistance random access memory device according to an eighth embodiment.

FIG. 13 is a cross-sectional view showing a resistance random access memory device according to the embodiment.

As shown in FIG. 13, the resistance random access memory device 8 according to the embodiment differs from the resistance random access memory device 5 (referring to FIG. 10) according to the fifth embodiment described above in that the resistance change layer 12 is not divided for each of the memory elements 10 and is provided continuously over the entire memory array layer 44.

According to the embodiment, the occurrence of damage to the resistance change layer 12 due to the patterning can be avoided because it is unnecessary to pattern the resistance change layer 12 in the manufacturing processes of the device 8. Also, the manufacturing processes of the device 8 can be simplified.

Otherwise, the configuration, the operations, and the effects of the embodiment are similar to those of the fifth embodiment described above.

Ninth Embodiment

A ninth embodiment will now be described.

Figure 14:
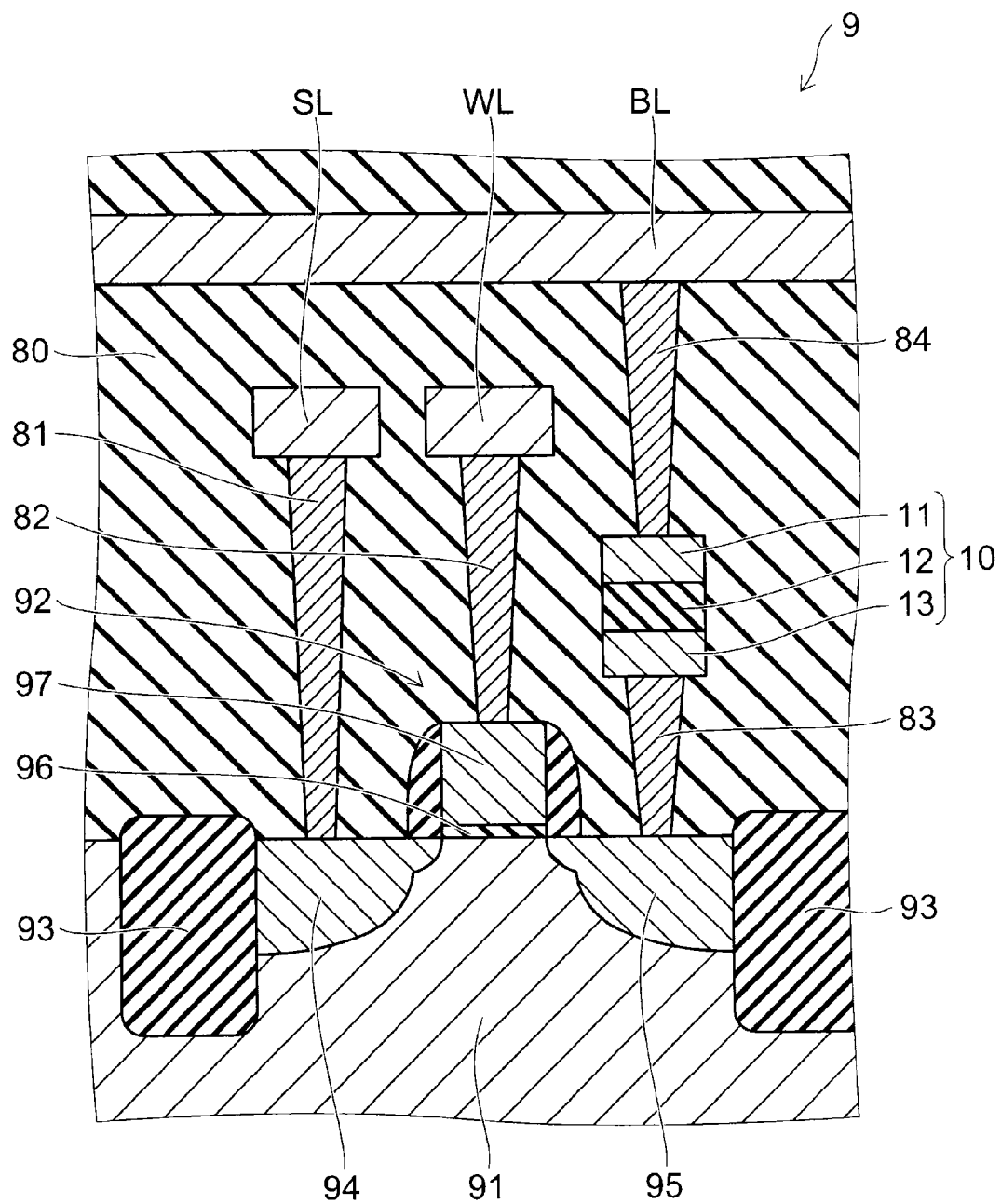
FIG. 14 is a cross-sectional view showing a resistance random access memory device according to a ninth embodiment.

FIG. 14 is a cross-sectional view showing a resistance random access memory device according to the embodiment.

As shown in FIG. 14, the resistance random access memory device 9 according to the embodiment is a 1T1R-type device. In the resistance random access memory device 9, a field effect transistor 92 is formed at the upper surface of a silicon substrate 91. In the transistor 92, a source layer 94 and a drain layer 95 are formed to be separated from each other in a region of the upper layer portion of the silicon substrate 91 that is partitioned by STI (shallow trench isolation) 93. A gate insulating film 96 is provided on the silicon substrate 91 in a region directly above the region between the source layer 94 and the drain layer 95; and a gate electrode 97 is provided on the gate insulating film 96.

Also, an inter-layer insulating film 80 is provided on the silicon substrate 91; and the memory element 10, the source line SL, the word line WL, and the bit line BL are provided inside the inter-layer insulating film 80. The source layer 94 is connected to the source line SL via a contact 81; the gate electrode 97 is connected to the word line WL via a contact 82; and the drain layer 95 is connected to the opposing electrode 13 of the memory element 10 via a contact 83. Also, the ion source electrode 11 of the memory element 10 is connected to the bit line BL by means of a via 84.

According to the embodiment, a 1T1R-type memory device can be realized.

Otherwise, the configuration, the operations, and the effects of the embodiment are similar to those of the first embodiment described above.

In the embodiment, common use of the ion source electrode 11 as the via 84 is possible; and common use of the opposing electrode 13 as the contact 83 is possible.

According to the embodiments described above, a resistance random access memory device having good state retention characteristics can be realized.

While certain embodiments have been described, these embodiments have been presented by way of example only, and are not intended to limit the scope of the invention. Indeed, the novel embodiments described herein may be embodied in a variety of other forms; furthermore, various omissions, substitutions and changes in the form of the embodiments described herein may be made without departing from the spirit of the invention. The accompanying claims and their equivalents are intended to cover such forms or modifications as would fall within the scope and spirit of the invention.

Further, the embodiments described above may be implemented in combination with each other. For example, although an example in which the memory element 10 is formed as the memory cell is illustrated in the fourth to ninth embodiments described above, the memory element 20 or the memory element 30 may be formed instead of the memory element 10.

What is claimed is:

1. A resistance random access memory device comprising:
   a first electrode comprising a metal;
   a second electrode comprising a material ionizing less easily than the metal; and
   a resistance change layer provided between the first electrode and the second electrode, the resistance change layer comprising silicon, oxygen, and nitrogen, a nitrogen concentration of the resistance change layer being less than 46 atomic % and not less than 20 atomic %, one of the metal being able to reversely move within the resistance change layer.

2. The resistance random access memory device according to claim 1, further comprising a rectifying layer provided between the first electrode and the resistance change layer or between the resistance change layer and the second electrode, a diffusion coefficient of the metal in the rectifying layer being higher than a diffusion coefficient of the metal in the resistance change layer.

3. The resistance random access memory device according to claim 1, further comprising:
   a first interconnect layer including a plurality of first interconnects extending in a first direction; and
   a second interconnect layer including a plurality of second interconnects extending in a second direction crossing the first direction,
   the first electrode being disposed between each of the first interconnects and each of the second interconnects.

4. The resistance random access memory device according to claim 3, further comprising
   an inter-layer insulating film provided between the first electrode electrically connected to a first one of the first interconnects and the first electrode electrically connected to a second one of the first interconnects,
   a diffusion coefficient of the metal in the inter-layer insulating film being higher than a diffusion coefficient of the metal in the resistance change layer.

5. The resistance random access memory device according to claim 4, wherein the inter-layer insulating film includes silicon, oxygen, and nitrogen, and a nitrogen concentration of the inter-layer insulating film is less than 20 atomic % or not less than 46 atomic %.

6. The resistance random access memory device according to claim 1, wherein the first electrode includes at least material selected from the group consisting of silver, copper, zinc, gold, titanium, nickel, cobalt, tantalum, aluminum, and bismuth, alloys thereof, and silicides thereof.

7. The resistance random access memory device according to claim 1, wherein a thickness of the resistance change layer is not more than 5 nm.

8. A resistance random access memory device, comprising:
   a first electrode comprising silver;
   a second electrode; and a resistance change layer provided between the first electrode and the second electrode, the resistance change layer comprising silicon, oxygen, and nitrogen, a nitrogen concentration of the resistance change layer being less than 46 atomic % and not less than 20 atomic %.

9. The resistance random access memory device according to claim 8, further comprising a first layer provided between the first electrode and the resistance change layer, the first layer containing silicon or a silicon oxide.

10. The resistance random access memory device according to claim 9, further comprising a second layer provided between the resistance change layer and the second electrode, the second layer containing silicon or a silicon oxide.

11. The resistance random access memory device according to claim 8, further comprising:
   a first interconnect layer including a plurality of first interconnects extending in a first direction; and
   a second interconnect layer including a plurality of second interconnects extending in a second direction crossing the first direction,
   the first electrode being disposed between each of the first interconnects and each of the second interconnects.

12. The resistance random access memory device according to claim 11, further comprising an inter-layer insulating film provided between the first electrode electrically connected to a first one of the first interconnects and the first electrode electrically connected to a second one of the first interconnects,
   the inter-layer insulating film including:
      silicon nitride films formed on two side surfaces of the first electrode electrically connected to the first one of the first interconnects and on two side surfaces of the first electrode electrically connected to the second one of the first interconnects, a nitrogen concentration of the silicon nitride film being less than 20 atomic % or not less than 46 atomic %; and
      a film having composition different from composition of the silicon nitride films formed between the silicon nitride films.

13. The resistance random access memory device according to claim 11, further comprising an inter-layer insulating film provided between the first electrode electrically connected to a first one of the first interconnects and the first electrode electrically connected to a second one of the first interconnects,
   the inter-layer insulating film including:
      silicon nitride films formed on two side surfaces of the first electrode electrically connected to the first one of the first interconnects and on two side surfaces of the first electrode electrically connected to the second one of the first interconnects, a nitrogen concentration of the silicon nitride film being less than 20 atomic % or not less than 46 atomic %; and
      a silicon oxide film formed between the silicon nitride films.

14. The resistance random access memory device according to claim 11, further comprising an inter-layer insulating film provided between the first electrode electrically connected to a first one of the first interconnects and the first electrode electrically connected to a second one of the first interconnects,
   the inter-layer insulating film including:
      silicon nitride films formed on two side surfaces of the first electrode electrically connected to the first one of the first interconnects and on two side surfaces of the first electrode electrically connected to the second one of the first interconnects, a nitrogen concentration of the silicon nitride film being less than 20 atomic % or not less than 46 atomic %; and
      an air gap formed between the silicon nitride films.

* * * * *